United States Patent
Madurawe

(10) Patent No.: US 7,176,713 B2
(45) Date of Patent: Feb. 13, 2007

(54) INTEGRATED CIRCUITS WITH RAM AND ROM FABRICATION OPTIONS

(75) Inventor: Raminda Udaya Madurawe, Sunnyvale, CA (US)

(73) Assignee: Viciciv Technology, Sunnyvale, CA (US)

( * ) Notice: Subject to any disclaimer, the term of this patent is extended or adjusted under 35 U.S.C. 154(b) by 396 days.

(21) Appl. No.: 10/751,324

(22) Filed: Jan. 5, 2004

(65) Prior Publication Data

US 2005/0149896 A1    Jul. 7, 2005

(51) Int. Cl.
*H03K 19/173*    (2006.01)
*H03K 19/177*    (2006.01)

(52) U.S. Cl. ............................. 326/38; 326/40; 326/47
(58) Field of Classification Search ............ 326/38, 326/39, 40, 41, 47, 49
See application file for complete search history.

(56) References Cited

U.S. PATENT DOCUMENTS

| | | | |
|---|---|---|---|
| 4,609,986 A | | 9/1986 | Hartmann et al. |
| 4,670,749 A | * | 6/1987 | Freeman ................... 326/38 |
| 4,706,216 A | | 11/1987 | Carter |
| 4,761,768 A | | 8/1988 | Turner et al. |
| 4,857,774 A | | 8/1989 | El-Ayat et al. |
| 4,870,302 A | | 9/1989 | Freeman |
| 4,873,459 A | | 10/1989 | El Gamal et al. |
| 5,343,406 A | | 8/1994 | Freeman et al. |
| 5,488,316 A | | 1/1996 | Freeman et al. |
| 5,600,264 A | * | 2/1997 | Duong et al. .................. 326/39 |
| 5,835,405 A | | 11/1998 | Tsui et al. |
| 5,844,422 A | | 12/1998 | Trimberger et al. |
| 6,208,163 B1 | | 3/2001 | Wittig et al. |
| 6,275,065 B1 | | 8/2001 | Mendel |
| 6,331,789 B2 | | 12/2001 | O-Bach |
| 6,448,808 B2 | | 9/2002 | Young et al. |
| 7,038,490 B1 | * | 5/2006 | Singh et al. .................. 326/41 |
| 2001/0003428 A1 | | 6/2001 | Or-Bach |
| 2002/0186044 A1 | | 12/2002 | Agrawal et al. |
| 2003/0001615 A1 | | 1/2003 | Sueyoshi et al. |
| 2003/0085733 A1 | | 5/2003 | Pugh et al. |

OTHER PUBLICATIONS

Seals & Whapshott, "Programmable Logic—PLDs and FPGAs", 1997, pp. 102-117, McGraw-Hill, USA, no month.
Ashok K. Sharma, "Programmable Logic Handbook—PLDs, CPLDs, & FPGAs", 1998, pp. 99-171, McGraw-Hill, no month.
S. M. Sze, "VLSI Technology", 1983, pp. 600-609, McGraw-Hill, New York, USA, no month.

* cited by examiner

Primary Examiner—Daniel Chang

(57) ABSTRACT

The present invention relates to electronic circuits that retain identical functionality and performance under RAM and hard-wire ROM fabrication options. An integrated circuit (IC) providing identical functionality and performance in two selectable fabrication options, wherein: a first selectable option comprises a user configurable circuit; and a second selectable option comprises a hard-wired circuit in lieu of said user configurable circuit. Such a programmable to hard-wire conversion provides a significant IC cost reduction at minimal NRE cost and improved reliability.

20 Claims, 6 Drawing Sheets

INTEGRATED CIRCUITS WITH RAM AND ROM FABRICATION OPTIONS

This application is related to application Ser. No. 10/267,484 entitled "Methods for Fabricating Three-Dimensional Integrated Circuits", application Ser. No. 10/267,483 entitled "Three Dimensional Integrated Circuits", and application Ser. No. 10/267,511 entitled "Field Programmable Gate Array With Convertibility to Application Specific Integrated Circuit", all of which were filed on Oct. 8, 2002 and list as inventor Mr. R. U. Madurawe, the contents of which are incorporated herein by reference.

BACKGROUND

The present invention relates to electronic circuits that retain identical functionality and performance under Random Access Memory (RAM) and Hard-Wire Read Only Memory (ROM) fabrication options.

Traditionally, application specific integrated circuit (ASIC) devices have been used in the integrated circuit (IC) industry to reduce cost, enhance performance or meet space constraints. The generic class of ASIC devices falls under a variety of sub classes such as Custom ASIC, Standard cell ASIC, Gate Array and Field Programmable Gate Array (FPGA) where the degree of user allowed customization varies. In this disclosure the word ASIC is used only in reference to Custom and Standard Cell ASICs where the designer has to incur the cost of a full fabrication mask set. The term FPGA denotes an off the shelf programmable device with no fabrication mask costs, and Gate Array denotes a device with partial mask costs to the designer. The devices FPGA include Programmable Logic Devices (PLD) and Complex Programmable Logic Devices (CPLD), while the devices Gate Array include Laser Programmable Gate Arrays (LPGA), Mask Programmable Gate Arrays (MPGA) and a new class of devices known as Structured ASIC or Structured Arrays.

The design and fabrication of ASICs can be time consuming and expensive. The customization involves a lengthy design cycle during the product definition phase and high Non Recurring Engineering (NRE) costs during manufacturing phase. In the event of finding a logic error in the custom or semi-custom ASIC during final test phase, the design and fabrication cycle has to be repeated. Such lengthy correction cycles further aggravate the time to market and engineering cost. As a result, ASICs serve only specific applications and are custom built for high volume and low cost. The high cost of masks and unpredictable device life time shipment volumes have caused ASIC design starts to fall precipitously in the IC industry. ASICs offer no device for immediate design verification, no interactive design adjustment capability, and require a full mask set for fabrication.

Gate Array customizes pre-defined modular blocks at a reduced NRE cost by designing the module connections with a software tool similar to that in ASIC. The Gate Array has an array of non programmable (or moderately programmable) functional modules fabricated on a semiconductor substrate. To interconnect these modules to a user specification, multiple layers of wires are used during design synthesis. The level of customization may be limited to a single metal layer, or single via layer, or multiple metal layers, or multiple metals and via layers. The goal is to reduce the customization cost to the user, and provide the customized product faster. As a result, the customizable layers are designed to be the top most metal and via layers of a semiconductor fabrication process. This is an inconvenient location to customize wires. The customized transistors are located at the substrate level of the Silicon. All possible connections have to come up to the top level metal. The complexity of bringing up connections is a severe constraint for these devices. Structured ASICs fall into larger module Gate Arrays. These devices have varying degrees of complexity in the structured cell and varying degrees of complexity in the custom interconnection. The absence of Silicon for design verification and design optimization results in multiple spins and lengthy design iterations to the end user. The Gate Array evaluation phase is no different to that of an ASIC. The advantage over ASIC is in a lower upfront NRE cost for the fewer customization layers, tools and labor, and the shorter time to receive the finished product. Gate Arrays offer no device for immediate design verification, no interactive design adjustment capability, and require a partial mask set for fabrication. Compared to ASICs, Gate Arrays offer a lower initial cost and a faster turnaround to debug the design. The end IC is more expensive compared to an ASIC.

In recent years there has been a move away from custom, semi-custom and Gate Array ICs toward field programmable components whose function is determined not when the integrated circuit is fabricated, but by an end user "in the field" prior to use. Off the shelf FPGA products greatly simplify the design cycle and are fully customized by the user. These products offer user-friendly software to fit custom logic into the device through programmability, and the capability to tweak and optimize designs to improve Silicon performance. In an FPGA, a complex logic design is broken down to smaller logic blocks and programmed into logic blocks provided in the FPGA. Logic blocks contain multiple smaller logic elements. Logic elements facilitate sequential and combinational logic design implementations. Combinational logic has no memory and outputs reflect a function solely of present input states. Sequential logic is implemented by inserting memory in the form of a flip-flop into the logic path to store past history. Current FPGA architectures include transistor pairs, NAND or OR gates, multiplexers, look-up-tables (LUT) and AND-OR structures in a basic logic element. In a PLD the basic logic element is labeled a macro-cell. Hereafter the terminology logic element will include both logic elements and macro-cells.

For sequential logic designs, the logic element may also include flip-flops. A MUX based exemplary logic element described in Ref-1 (Seals & Whapshott) is shown in FIG. 1A. The logic element has a built in D-flip-flop 105 for sequential logic implementation. In addition, elements 101, 102 and 103 are 2:1 MUX's controlled by one input signal for each MUX. Input S1 feeds into 101 and 102, while inputs S1 and S2 feed into OR gate 104, and the output from OR gate feeds into 103. Element 105 is the D-Flip-Flop receiving Preset, Clear and Clock signals. One may very easily represent the programmable MUX structure in FIG. 1A as a 2-input LUT; where A, B, C & D are LUT values, and S1, (S2+S3) are LUT inputs. Ignoring the global Preset & Clear signals, eight inputs feed into the logic block, and one output leaves the logic block. All 2-input, all 3-input and some 4-input variable functions are realized in the logic block and latched to the D-Flip-Flop. Inputs and outputs for the Logic Element or Logic Block are selected from the programmable Routing Matrix. An exemplary routing matrix containing logic elements as described in Ref-1 is shown in FIG. 1B. Each logic element 112 is as shown in FIG. 1A. The 8 inputs and 1 output from logic element 112 in FIG. 1B are routed to 22 horizontal and 12 vertical interconnect wires that have programmable via connections 110. These connections 110 may be anti-fuses or pass-gate transistors controlled by SRAM memory elements. The user selects how the wires are connected during the design phase, and programs the connections in the field. FPGA architectures for various commercially available FPGA devices are discussed in Ref-1 (Seals & Whapshott) and Ref-2 (Sharma).

Provision of this programmability is expensive in terms of Silicon real estate, but reduces design cycle time, time to solution (TTS) and upfront NRE cost to the designer. FPGAs offer the advantages of no NRE costs, fast turnaround (designs can be placed and routed on an FPGA in typically a few minutes), and low risk since designs can be easily amended late in the product design cycle. It is only for high volume production runs that there is a cost benefit in using the other two approaches. Compared to FPGA, an ASIC and Gate Array both have hard-wired logic connections, identified during the chip design phase. ASIC has no multiple logic choices and both ASIC and most Gate Arrays have no configuration memory to customize logic. This is a large chip area and a product cost saving for these approaches to design The larger Silicon area for programmability in an FPGA causes two events that aggravate cost: larger chip area leads to less total available die in a wafer, larger chip area has a higher chance of having a defect that will make it non-functional. Of the two events, the former is proportional to die area while the latter is exponential to die area and dominates the cost of the product. A full custom ASIC has customized logic functions which take less gate counts compared to Gate Arrays and FPGA configurations of the same functions. Thus, an ASIC is significantly smaller, faster, cheaper and more reliable than an equivalent gate-count FPGA. A Gate Array is also smaller, faster and cheaper compared to an equivalent FPGA. The trade-off is between time-to-market (FPGA advantage) versus low cost and better reliability (ASIC advantage). A Gate Array falls in the middle with an improvement in the ASIC NRE cost at a moderate penalty to product cost and performance. The killer defects found in the extra area for programmability in an FPGA compared to ASIC and Gate Array contribute to a significant portion of the extra cost the user has to bear for customer re-configurability of logic functions. A method to reduce an FPGA final die cost would greatly enhance the cost parity between an FPGA and an ASIC.

FPGA and Gate Array architectures are discussed in Hartmann et al. (U.S. Pat. No. 4,609,986), Carter (U.S. Pat. No. 4,706,216), Turner et al. (U.S. Pat. No. 4,761,768), El-Ayat et al. (U.S. Pat. No. 4,857,774), Freeman (U.S. Pat. No. 4,870,302), El Gamal et al. (U.S. Pat. No. 4,873,459), Freeman et al. (U.S. Pat. No. 5,343,406), Freeman et al (U.S. Pat. No. 5,488,316), Tsui et al. (U.S. Pat. No. 5,835,405), Trimberger et al. (U.S. Pat. No. 5,844,422), Wittig et al. (U.S. Pat. No. 6,208,163), Or-Bach (2001/0003428), Mendel (U.S. Pat. No. 6,275,065), Or-Bach (U.S. Pat. No. 6,331,789), et al. (U.S. Pat. No. 6,448,808), Agrawal et al. (2002/0186044), Sueyoshi at al. (2003/0001615) and Pugh et al. (2003/0085733). These patents disclose programmable AND/OR array, MUX and LUT structures and routing blocks to build logic blocks that are user configurable. The configuration memory element comprises multiple transistors. SRAM memory has six transistors in a cell. Single poly EEPROM has three transistors, one capacitor and one tunneling diode in a cell. In all cases the memory element together with a configuration circuit allows the user to program the device. This programmable overhead creates a significant cost burden due to enhanced Silicon area and killer defects compared to a non-configurable solution. Addition of redundant circuits in an FPGA to repair some faulty circuits is not sufficient to reduce the cost disparity. There is no provision in the referenced disclosures for a user to get to a lower cost solution from an FPGA without having to re-engineer the entire design to either a Gate Array or an ASIC platform.

Logic elements include programmable point to point connections. Four exemplary methods of programmable point to point connections, synonymous with programmable switches, between node A and node B are shown in FIG. 2. Configuration circuits to program connections are shown in FIG. 3, FIG. 4 and FIG. 5. All the patents listed under FPGA architectures use one or more of these basic programmable connections. In FIG. 2A, a conductive fuse link 210 connects A to B. It is normally connected, and passage of a high current or exposure to a laser beam will blow the conductor open. In FIG. 2B, a capacitive anti-fuse element 220 disconnects A from B. It is normally open, and passage of a high current will pop the insulator shorting the two terminals. Fuse and anti-fuse are both one time programmable due to the non-reversible nature of the change. In FIG. 2C, a pass-gate device 230 connects A to B. The gate signal $S_0$ determines the nature of the connection, on or off. This is a non destructive change. The gate signal is generated by manipulating logic signals, or by configuration circuits that include memory. The choice of memory varies from user to user. In FIG. 2D, a floating-pass-gate device 240 connects A to B. Control gate signal $S_0$ couples a portion of that to floating gate. Electrons trapped in the floating gate determines an on or off state for the connection. Hot-electrons and Fowler-Nordheim tunneling are two mechanisms for injecting charge to floating-gates. When high quality insulators encapsulate the floating gate, trapped charge stays for over 10 years. These provide non-volatile memory. EPROM, EEPROM and Flash memory employ floating-gates and are non-volatile. Anti-fuse and SRAM based architectures are widely used in commercial FPGA's, while EPROM, EEPROM, anti-fuse and fuse links are widely used in commercial PLD's. Volatile SRAM memory needs no high programming voltages, is freely available in every logic process, is compatible with standard CMOS SRAM memory, lends to process and voltage scaling and has become the de-facto choice for modern day very large FPGA device construction.

Most commercially available high density FPGA's use SRAM memory elements. A volatile six transistor SRAM based configuration circuit is shown in FIG. 3A. This is the SRAM of choice in the listed patents. Two inverters 303 and 304 connected back to back form the memory element. This memory element is a latch providing complementary outputs $S_0$ and $S_0'$. The latch can be constructed as full CMOS, R-load, PMOS load or any other. Power and ground terminals for the inverters are not shown in FIG. 3A. Access NMOS transistors 301 and 302, and access wires GA, GB, BL and BS provide the means to configure the memory element. Applying zero and one on BL and BS respectively, and raising GA and GB high enables writing zero into device 301 and one into device 302. The output $S_0$ delivers a logic one. Applying one and zero on BL and BS respectively, and raising GA and GB high enables writing one into device 301 and zero into device 302. The output $S_0$ delivers a logic zero. The SRAM construction may allow applying only a zero signal at BL or BS to write data into the latch. The SRAM cell may have only one access transistor 301 or 302. The SRAM latch will hold the data state as long as power is on. When the power is turned off, the SRAM bit needs to be restored to its previous state from an outside permanent memory. In the literature for programmable logic, this second non-volatile memory is also called configuration memory. Upon power up, an external or an internal CPU loads the external configuration memory to internal configuration memory locations. All of FPGA functionality is controlled by the internal configuration memory. The SRAM configuration circuit in FIG. 3A controlling logic pass-gate is illustrated in FIG. 3B. Element 350 represents the configuration circuit. The $S_0$ output directly driven by the memory element shown in FIG. 3A drives the pass-gate 310 gate electrode. In addition to $S_0$ output and the memory cell, power, ground, data-in and write-enable signals in 350 constitutes the SRAM configuration circuit. Write enable circuitry includes GA, GB, BL, BS signals shown in FIG. 3A.

For an emulation device, the cost of programmability is not the primary concern if such a device provides a migration path to a lower cost production solution. Today an FPGA migration to a Gate Array requires a new design to ensure timing closure. The FPGA and the Gate Array devices are completely different dies, manufactured with completely different mask sets, having identical functionality. A desirable migration path is to keep the timing of the original FPGA design intact. That would avoid valuable re-engineering time, prevent opportunity costs and save invaluable time to solution (TTS). Such a conversion is preferable in the same base die to avoid manufacturing logistics complexity, save on Silicon and system re-qualification costs and avoid implementation delays. Such a conversion should also realize a lower cost end product that is competitive with an equivalent standard cell ASIC or a Gate Array product in cost. Such an FPGA device will readily target applications that are cost sensitive, have short life cycles and demand medium volumes.

SUMMARY

In one aspect, an integrated circuit (IC) providing identical functionality and performance in two selectable fabrication options, wherein: a first selectable option comprises a user configurable circuit; and a second selectable option comprises a hard-wired circuit in lieu of said user configurable circuit.

In a second aspect, a programmable logic device (PLD) comprising two selectable memory construction options to control logic, wherein: a first selectable option comprises a random access memory (RAM) construction; and a second selectable option comprises a hard-wire read only memory (ROM) construction.

In a third aspect, a configurable pass-gate logic element for a PLD, said pass-gate electrically coupling two nodes, said configuration achieved by a memory element, said memory element comprising two selectable construction options, wherein: a first selectable option constitutes a random access memory (RAM) construction; and a second selectable option constitutes a hard-wire read only memory (ROM) construction.

Implementations of the above aspects may include one or more of the following. A system design may be specified by the user in VHDL or Verilog design input language and synthesized to a gate-level netlist description. Synthesized netlist may be ported into a PLD, an FPGA, a Gate Array or used to construct a standard cell or custom ASIC. The final Integrated Circuit may include a programmable logic core to incorporate glue logic or other logic functions that could change at the last minute of system design. The programmable logic core may also provide some flexibility into otherwise a fixed IP Integrated Circuit to allow some degree of customer configurability. A PLD or an FPGA may include some fixed IP such as memory, adders, multipliers and I/O (Input/Output) to provide some standard features. Programmability in an FPGA and FPGA core is achieved by a configuration circuit that includes a memory module.

The memory in a first selectable construction is a Random Access Memory (RAM) module. The memory is one of volatile or non-volatile memory. Volatile memory includes DRAM, SRAM, and Optical cells, among other types of memory. Non-volatile memory includes fuses, anti-fuses, EPROM, EEPROM, Flash, Ferro-electric, Electro-Chemical and Magnetic memory. The most common memory element is a six transistor SRAM cell. The memory element generates an output signal which controls the logic state of a pass-gate logic element. A pass-gate logic element is also known as a switch. A pass-gate is an NMOS transistor, or a PMOS transistor or a CMOS transistor pair that can electrically connect two points. Programming these pass-gate devices include forming one of either a conducting path or a non-conducting path in the connecting device. The configuration circuit consumes a large Silicon area. The larger area reduces the total die available in a wafer, increasing the die cost. The larger area is more prone to collecting a killer defect. The killer defects reduce the number of good die in a wafer, thus impacting the cost of a good die. The user benefits by the ability to configure circuits at the expense of a higher die cost. The RAM memory provides an off-the-shelf programmable device and saves TTS for the user.

The memory in a second selectable construction is a Read Only Memory (ROM). The ROM comprises hard-wire connections to power and ground buses. The ROM module cannot provide user configurability. The ROM is therefore generated by a finalized RAM pattern from the first selectable option. Both RAM and ROM options are provided in the same base Silicon die, with no changes to a majority of manufacturing mask sets and fabrication process. Both RAM and ROM elements control the very same logic gates. Each RAM pattern will generate a unique ROM pattern to duplicate identical logic functionality. Hard-wire ROM pattern may include coupling power-bus and ground-bus to pass-gate logic in lieu of RAM control signals. The ROM option may include one custom mask. The hard-wire ROM option may include two or more custom masks. The goal is to minimize the number of customized masks and to keep the non recurring engineering (NRE) costs to a minimum. Signal propagation wires and transistors are unchanged between the two memory options. There is no timing impact between the two options avoiding lengthy re-engineering time and cost. The die is identical between the two options avoiding re-qualification costs. There are only one or two custom masks in the ROM option, keeping the logistics involved in manufacturing RAM and ROM versions simple. The hard-wire ROM circuits mitigate the risk of killer defects in configuration circuits. The hard-wire ROM option uses less available logic choices, leaving unused circuits redundant. Unused circuits do not impact ROM die yield. ROM option provides an apparent defect density reduction and a higher yield. The ROM option provides a significant cost reduction for a RAM based FPGA.

Once the programming is finalized by the user, the programmable connections set by RAM bit pattern are fixed for most designs during product life cycle. Programmability is no longer needed and no longer valuable to the user. The user may convert the design to a lower cost hard-wire ROM circuit without altering the original RAM design. The programmed choices are mapped from RAM to hard-wire ROM. RAM outputs at logic one are mapped to ROM wires connected to power. RAM outputs at logic zero are mapped to ROM wires connected to ground. This may be done with a single metal mask. Such elimination of configuration circuits, including configuration memory, reduces the die cost of the ROM version. The propagation delays and critical path timing in the Integrated Circuit may be substantially identical between the two memory module options. Duplicated ROM pattern may be done with a customized thru-hole mask. Customization may be done with a thru-hole and a metal mask or a plurality of thru-hole and metal masks. Hard wire pattern improves reliability and reduces defect density of the final product. The ROM pattern provides a cost economical final product to the user at a very low NRE cost. The total solution provides a programmable and customized solution to the user in a single die.

The programmable circuits described constitute fabricating a VLSI IC product. The IC product is re-programmable in its initial stage with turnkey conversion to a one mask customized ASIC. The IC has reasonable cost parity with an ASIC cost and has initial off the shelf FPGA with re-programmability. The IC product offering occurs in two phases: the first phase is a generic PLD that has re-programmability contained in a programmable module, and a second phase is an ASIC that has the entire programmable module replaced by one or two customized hard-wire masks. Both FPGA version and turnkey custom ASIC has the same base die. No re-qualification is required by the conversion. The design and layout of these product families adhere to alterable memory concept: ensuring the functionality and timing of the product in its RAM and ROM canonicals. An easy turnkey customization of an end ASIC from an original programmable device would greatly enhance time to market, performance, product reliability and solution cost.

DESCRIPTION

Figure 1A:
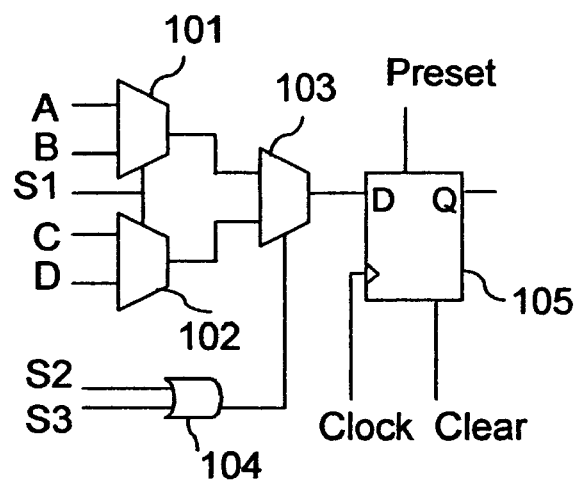
FIG. 1A shows an exemplary MUX based logic element.
Figure 1B:
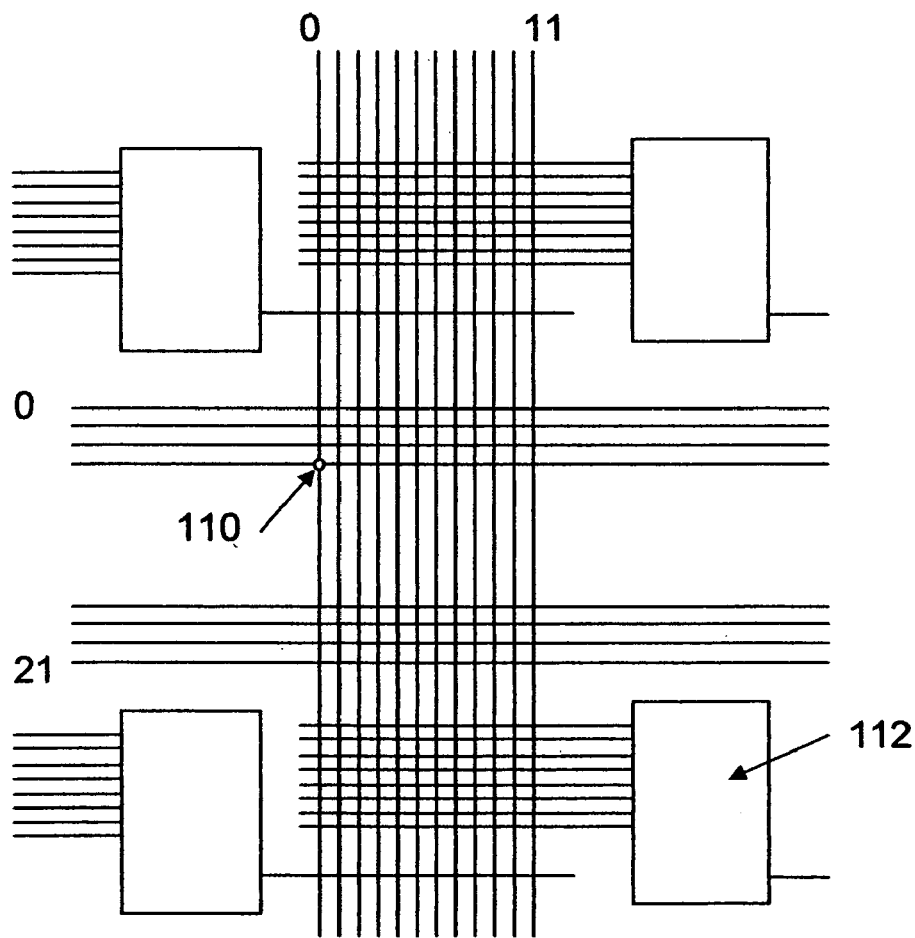
FIG. 1B shows an exemplary programmable wire structure utilizing a logic element.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate.

The term pass-gate refers to a structure that can pass a signal when on, and blocks signal passage when off. A pass-gate connects two points when on, and disconnects two points when off. A pass-gate can be a floating-gate transistor, an NMOS transistor, a PMOS transistor or a CMOS transistor pair. The gate electrode of pass-gate determines the state of the connection. A CMOS pass-gate requires complementary signals coupled to NMOS and PMOS gate electrodes. A control logic signal is connected to gate electrode of a pass-gate for programmable logic.

The term configuration circuit includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. Configuration circuit does not include the logic pass-gate controlled by said memory element. In one embodiment, the configuration circuit includes a plurality of RAM circuits to store instructions to configure an FPGA. In another embodiment, the configuration circuit includes a first selectable configuration where a plurality of RAM circuits is formed to store instructions to control one or more circuit blocks. The configuration circuits include a second selectable configuration with a predetermined ROM conductive pattern formed in lieu of the RAM circuit to control substantially the same circuit blocks. The memory circuit includes elements such as diode, transistor, resistor, capacitor, metal link, wires, among others. The memory circuit also includes thin film elements. In yet another embodiment, the configuration circuits include a predetermined conductive pattern, contact, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

The present invention attempts to realize a significant cost reduction in the conversion of RAM circuits to hard-wire ROM circuits. RAM circuits are useful for the user to configure circuits. ROM circuits have no user configurability. Such a RAM to ROM conversion needs to maintain the functionality and timing characteristics of the original RAM circuits, not change the die foot-print, simplify or maintain the fabrication process steps and have minimal customization cost. First a conversion method is described to map a user configured RAM pattern to a hard-wire ROM pattern. The method of conversion makes no impact to timing and functionality of logic in the resulting cheaper die. Second, the usefulness of such a scheme is discussed. Such a conversion makes all of the configuration memory and a plurality of extraneous circuits redundant in an integrated circuit. Most defects associated with those do not hurt the die yield. Furthermore, multiple logic choices are eliminated by the hard-wire option to a single choice. Any defect impacting the unselected logic choices also do not hinder the die yield.

Figure 3A:
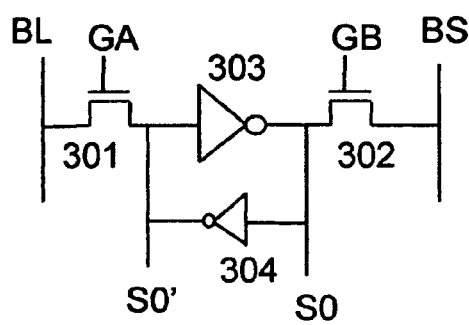
FIG. 3A shows an exemplary configuration circuit for a 6T SRAM element.
Figure 3B:
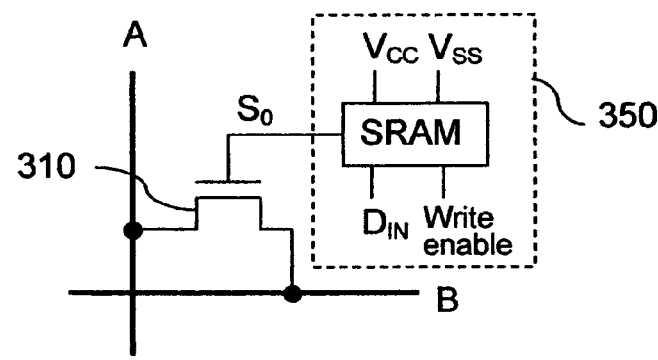
FIG. 3B shows an exemplary programmable pass-gate switch with SRAM memory.

Programmable logic use point to point connections that utilize programmable pass-gate logic as shown in FIG. 3A and FIG. 3B. Multiple inputs (node A) can be connected to multiple outputs (node B) with a plurality of pass-gate logic elements. The SRAM base connection shown in FIG. 3 may have pass-gate 310 as a PMOS or an NMOS transistor. NMOS is preferred due to its higher conduction. The voltage $S_0$ on NMOS transistor 310 gate electrode determines an ON or OFF connection. That logic level is generated by a configuration circuit 350 coupled to the gate of NMOS transistor 310. The pass-gate logic connection requires the configuration circuitry to generate signal $S_0$ with sufficient voltage levels to ensure off and on conditions. For an NMOS pass-gate, $S_0$ having a logic level one completes the point to point connection, while a logic level zero keeps them disconnected. In addition to using only an NMOS gate, a PMOS gate could also be used in parallel to make the connection. The configuration circuit 350 needs to then provide complementary outputs ($S_0$ and $S_0'$) to drive NMOS and PMOS gates in the connection. Configuration circuit 350 contains a memory element. Most CMOS SRAM memory delivers complementary outputs. This memory element can be configured by the user to select the polarity of $S_0$, thereby selecting the status of the connection. The memory element can be volatile or non-volatile. In volatile memory, it could be DRAM, SRAM, Optical or any other type of a memory device that can output a valid signal $S_0$. In non-volatile memory it could be fuse, anti-fuse, EPROM, EEPROM, Flash, Ferro-Electric, Magnetic or any other kind of memory device that can output a valid signal $S_0$. The output $S_0$ can be a direct output coupled to the memory element, or a derived output in the configuration circuitry. An inverter can be used to restore $S_0$ signal level to full rail voltage levels. The SRAM in configuration circuit 350 can be operated at an elevated Vcc level to output an elevated $S_0$ voltage level. This is especially feasible when the SRAM is wired separately to work at an elevated Vcc. Other configuration circuits to generate a valid $S_0$ signal are discussed next.

Figure 4A:
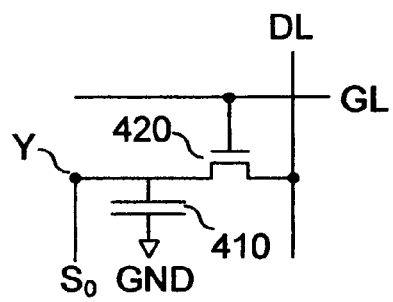
FIG. 4A shows a volatile DRAM based configuration circuit.

A volatile DRAM based configuration circuit to use with this invention is shown next in FIG. 4A. Configuration circuit 350 in FIG. 3B can be replaced with the DRAM circuit shown in FIG. 4A. In FIG. 4A, output level $S_0$ is generated from node Y which is coupled to capacitor 410 and NMOS transistor 420 source as shown. NMOS transistor 420 is arranged in an individually addressable grid with a row line GL and a bit line DL. GL is coupled to the gate of 420, while DL is coupled to the drain of 420. Capacitor 410 is a storage device retaining charge for a sufficiently long period of time between two refresh signals. When the capacitor 410 is storing a "1", DL voltage is set to Vcc and GL is pulsed to charge node Y to Vcc voltage level. GL voltage may be a raised voltage level beyond Vcc to charge node Y fully to Vcc. Pulse characteristics are chosen to allow sufficient time for node Y to charge. Signal $S_0$ becomes a logic one. When the capacitor 410 is storing a "0", DL voltage is set to Vss and GL is pulsed to charge node Y to Vss voltage level. GL voltage level at Vcc is sufficient to discharge node Y fully to Vss. Pulse characteristics are chosen to allow sufficient time for node Y to discharge. Signal $S_0$ becomes a logic zero. This pulsing is continued at a regular frequency to charge or discharge node Y in the DRAM cell.

Figure 4B:
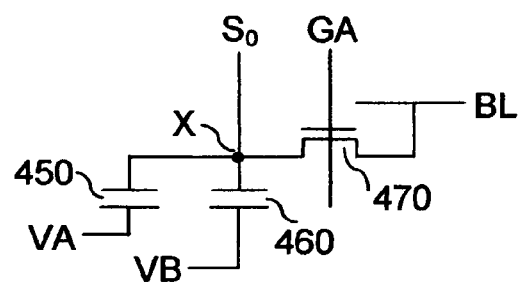
FIG. 4B shows a non-volatile anti-fuse based configuration circuit.

A non-volatile anti-fuse based configuration circuit is shown next in FIG. 4B. Configuration circuit 350 in FIG. 3B can be replaced with the anti-fuse circuit shown in FIG. 4B. In FIG. 4B, output level $S_0$ is generated from node X which is coupled to signals VA and VB via two anti-fuses 450 and 460 respectively. Node X is connected to a programming access transistor 470 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 470. A high voltage is applied across anti-fuse 450 to pop the dielectric and short the terminals. Similarly anti-fuse 460 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power, or elevated Vcc) is applied to the two signal lines. Depending on the blown fuse, signal $S_0$ will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 5A:
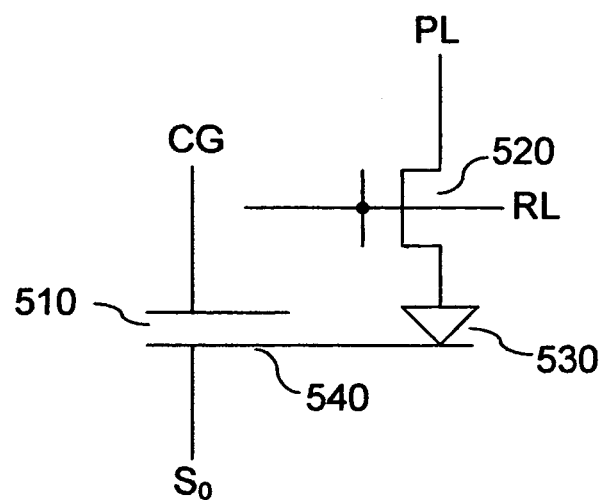
FIG. 5A shows a first embodiment of a floating gate configuration circuit.
Figure 5B:
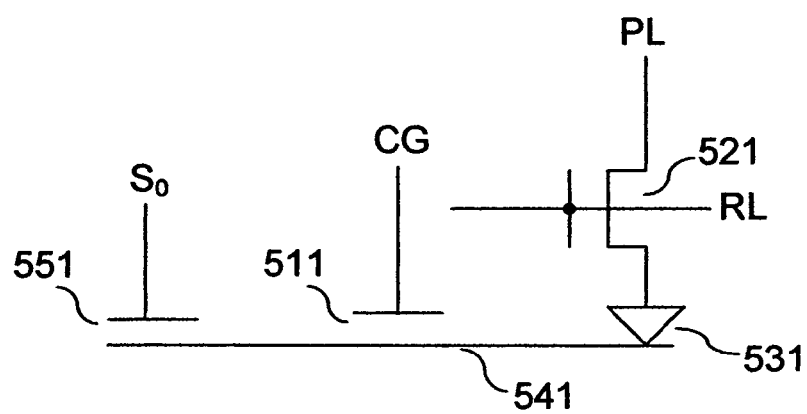
FIG. 5B shows a second embodiment of a floating gate configuration circuit.

FIG. 5 shows two non-volatile EEPROM configuration circuits that can be used in this invention. Configuration circuit 350 in FIG. 3B can be replaced with either of two EEPROM circuit shown in FIG. 5A and FIG. 5B. In FIG. 5A, node 540 is a floating gate. This is usually a poly-Silicon film isolated by an insulator all around. It is coupled to the source end of programming transistor 520 via a tunneling diode 530. The tunneling diode is a thin dielectric capacitor between floating poly and substrate Silicon with high doping on either side. When a large programming (or erase) voltage Vpp is applied across the thin dielectric, a Fowler-Nordheim tunneling current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erasure can be done while the chip is in a system. It is hence called in system programmable (ISP). An oxide or dielectric capacitor 510 couples the floating gate (FG) 540 to a control gate (CG). The control gate CG can be a heavily doped Silicon substrate plate or a second poly-Silicon plate above the floating poly. The dielectric can be oxide, nitride, ONO or any other insulating material. A voltage applied to CG will be capacitively coupled to FG node 540. The coupling ratio is designed such that 60–80 percent of CG voltage will be coupled to FG node 540. To program this memory element, a negative charge must be trapped on the FG 540. This is done by applying positive Vpp voltage on CG, ground voltage on PL and a sufficiently high (Vcc) voltage on RL. CG couples a high positive voltage onto FG 540 creating a high voltage drop across diode 530. Electrons move to the FG 540 to reduce this electric field. When the memory device is returned to normal voltages, a net negative voltage remains trapped on the FG 540. To erase the memory element, the electrons must be removed from the floating gate. This can be done by UV light, but an electrical method is more easily adapted. The CG is grounded, a very high voltage (Vpp+more to prevent a threshold voltage drop across 520) is applied to RL, and a very high voltage (Vpp) is applied to PL. Now a low voltage is coupled to FG with a very high positive voltage on the source side of device 520. Diode 530 tunneling removes electrons from FG. This removal continues beyond a charge neutral state for the isolated FG. When the memory device is returned to normal voltages, a net positive voltage remains trapped on the FG 540. Under normal operation RL is grounded to isolate the memory element from the programming path, and PL is grounded. A positive intermediate voltage Vcg is applied to CG terminal. FG voltage is denoted $S_0$. Under CG bias, $S_0$ signal levels are designed to activate pass-gate logic correctly. Configuration circuit in FIG. 5B is only different to that in FIG. 5A by the capacitor 551 used to induce $S_0$ voltage. This is useful when $S_0$ output is applied to leaky pass-gates, or low level leakage nodes. As gate oxide thicknesses reach below 50 angstroms, the pass-gates leak due to direct tunneling.

These configuration circuits, and similarly constructed other configuration circuits, can be used in programmable logic devices. Those with ordinary skill in the art may recognize other methods for constructing configuration circuits to generate a valid $S_0$ output. The pass-gate logic element is not affected by the choice of the configuration circuit.

SRAM memory technology has the advantage of not requiring a high voltage to configure memory. The SRAM based switch shown in FIG. 3B containing the SRAM memory circuit shown in FIG. 3A utilizes 6 extra configuration transistors, discounting the pass-gate 310, to provide the programmability. That is a significant overhead compared to application specific and hard-wired gate array circuits where the point to point connection can be directly made with metal. Similarly other programmable memory elements capable of configuring pass-gate logic also carry a high Silicon foot print. A cheaper method of constructing a vertically integrated SRAM element and conversions of such circuits to hard-wired cheaper options is described in incorporated by references. In the present disclosure, the conversion is applied to monolithic Silicon circuits, where SRAM and logic circuits are constructed on the same Silicon substrate. Thus in FIG. 3B, all six configuration transistors shown in 350 are constructed in Silicon substrate layers, side by side with the pass transistor 310. Transistor 310 is in the conducting path of the point to point connection and is common to RAM and ROM options in memory. As the SRAM based configuration circuit foot print is very expensive to the user, an alternative cheaper, simpler ROM solution has tremendous value in the IC industry.

Figure 6:
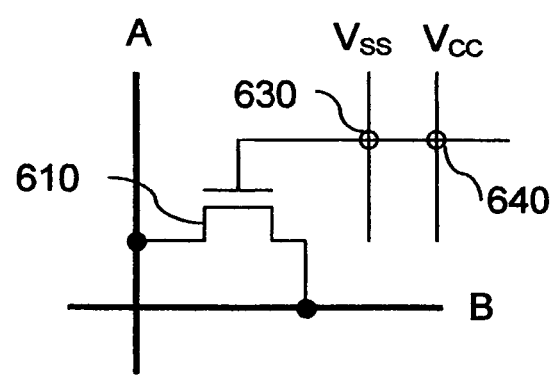
FIG. 6 shows a hard-wire ROM mapping of a point to point RAM switch.

The RAM point to point connection in FIG. 3B in a first selectable option is replaced by a hard-wire ROM point to point connection in a second selectable option as shown in FIG. 6. In FIG. 3B the pass-gate gate electrode receives one of two voltage levels from the SRAM memory element: logic zero which is at ground-bus (Vss) voltage, logic one which is at power-bus (Vcc) voltage. Both these logic levels are locally available in the SRAM power and ground wires as shown in FIG. 3B. In FIG. 6, the gate input signal to pass-gate 610 is replaced by one of two possible hard-wire connections: connection 630 to Vss or connection 640 to Vcc. The connections are made in metal or contacts between metal by customizing one or two masks during the fabrication process. In a preferred embodiment, these connections are made by customizing the first contact mask. In a second embodiment, these connections are made by customizing the first metal mask. Based on the $S_0$ output state being 0 or 1 in the RAM bit to map into a conductive pattern, either Vss or the Vcc connection is chosen. $S_0$ and $S_0'$ outputs in FIG. 3A are mapped appropriately. Comparing RAM option in FIG. 3B with ROM option in FIG. 6, the A to B point to point connection is identical between the two control options. The signal delay through the pass-gate also remains identical. Timing characteristics of complex designs utilizing a plurality of these switches stay intact during this conversion.

Figure 2A:
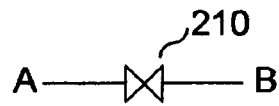
FIG. 2A shows an exemplary fuse link point to point connection.
Figure 2B:
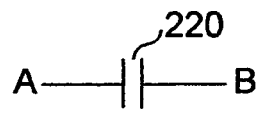
FIG. 2B shows an exemplary anti-fuse point to point connection.
Figure 2C:
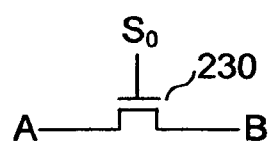
FIG. 2C shows an exemplary pass-gate point to point connection.
Figure 2D:
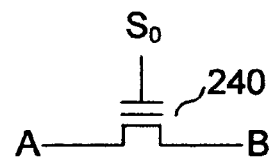
FIG. 2D shows an exemplary floating-pass-gate point to point connection.
Figure 7A:
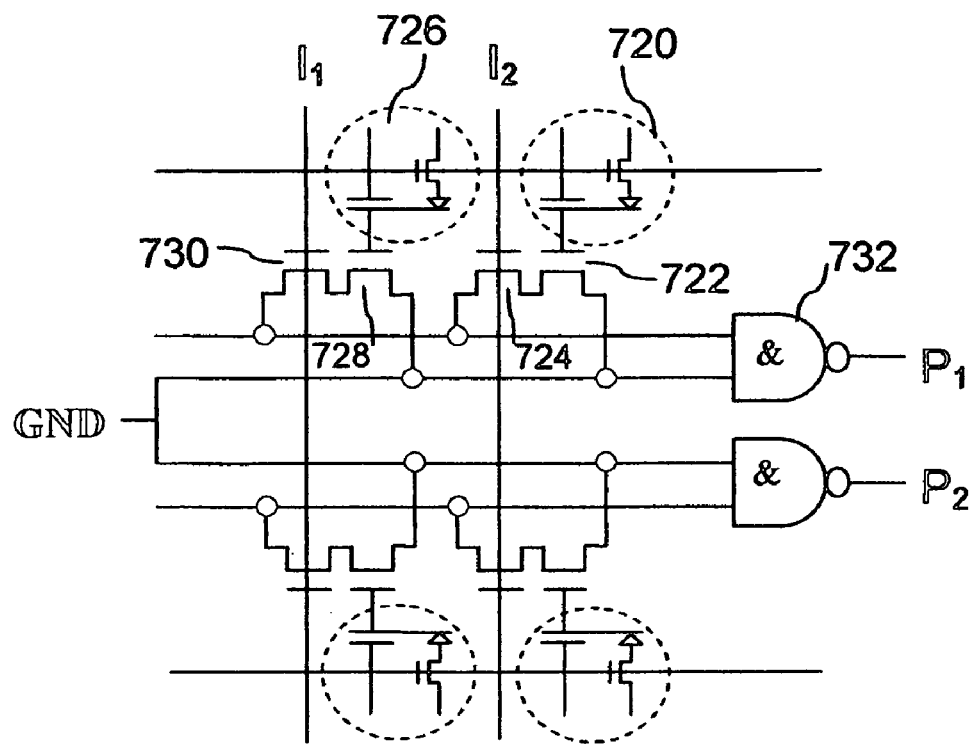
FIG. 7A shows an EEPROM based NAND-NOR logic Product Term in a PLD.

FIG. 7 shows an EEPROM non-volatile memory element between RAM and hard-wire ROM fabrication options. The gate diagrams in FIG. 7 show Product-Terms (also known as P-Terms) in NAND-NOR logic implementation. FIG. 7A shows two mirrored programmable P-Term outputs P1 and P2. For output P1, a NAND gate 732 comprising a pull-up device receives pull down signals from pass transistors 722, 724 pair and 728, 730 pair. The floating-pass-gate 722 is controlled by configuration block 720 shown in the dashed circle, while the floating-pass-gate 728 is controlled by a similar block 726 shown inside the dashed circle. These configuration blocks 720 and 726 in FIG. 7A were discussed with respect to FIG. 5A, and they provide control signals for programmable floating-pass-gate switches as shown in FIG. 2D. Blocks 720 and 726 can be replaced with any one of configuration circuits shown in FIG. 3, FIG. 4 or FIG. S. In FIG. 7A, input signals $I_1$ and $I_2$, pass transistors 722, 724, 728, 730 and the NAND gate 732 show the signal path for logic functions in the PLD. The signal path is not affected by the choice of the configuration circuit controlling floating-pass-gates 722 and 728. The voltage output levels applied to the gates of device 722 and 728 are designed to turn those off or on at a pre-selected control gate (CG) operating voltage. The pass gates 724 and 722 are sized such that the current controlling device is transistor 724 and not the floating-pass-gate 722. That is done to prevent the pull down current strength changing due to charge loss in a floating gate device. Floating-gate devices have to be functional over a 10 years life time, and charge trapped on the floating-gate decay very slowly over time.

Figure 7B:
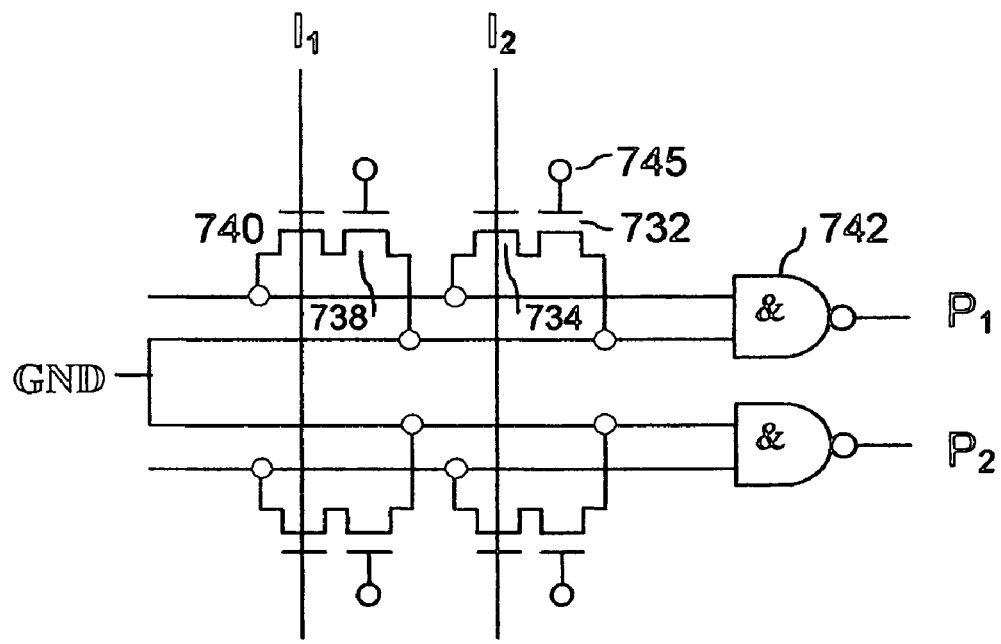
FIG. 7B shows a hard-wire ROM mapping of NAND-NOR logic Product Term in a PLD.

The programmable RAM circuit shown in FIG. 7A is mapped to the hard-wire ROM circuit as shown in FIG. 7B. An EEPROM bit floating gate 732 in conducting mode under the RAM option is replaced by the same floating-gate hard-wired to a Vcc bus connection 745. Likewise an off EEPROM floating gate would be replaced by the floating-gate hard-wired to a ground-bus connection. Clearly the ROM substitution is immune to charge loss or charge gain and is more reliable. In addition, the EEPROM under ROM substitution does not require high voltage for programming or erase, an operation very stressful to the oxides in the fabrication process with high yield fall-out. In the case of EEPROM fabrication, the manufacturing process can be even made simpler by eliminating the extra EEPROM related processing steps to achieve an additional cost savings for the ROM die. Such process simplifications are possible when the RAM module is integrated to a logic process by inserting the custom processing steps. Except for the floating-gate on/off control option, all other physical transistors and wires are identical between the RAM and ROM fabrication options. That allows for identical functionality and timing between the two versions.

This method of ROM substitution is possible in all RAM applications where the output generated by the RAM bit is at binary voltage levels. Binary voltages are easily realized by hard-wire connections to power-bus and ground-bus. All SRAM based FPGAs and single poly PLDs commercially available, listed in Ref-1 & Ref-2 and discussed in the listed patents have binary voltage outputs. Commercially available anti-fuse based FPGAs only provide anti-fuse elements between two wires. Under the method disclosed, the Anti-fuse RAM elements are replaced in the ROM version with either a thru-holes connection or an absence of a thru-hole connection with one custom mask. There are many PLDs designed with double poly EPROM and FLASH processing technologies that do not lend to this method of easy ROM conversion. In a single floating-gate double poly transistor, the floating-gate is fully buried under the control gate, and there is no easy access to the floating gate. However, the floating-gate transistors may be replaced by normal transistors for a ROM option, with all the "on" bits in a row line having their gates coupled to a common row line, and all the "off" bits in that row line having their gates disconnected from the row line and tied to ground.

The impact of programmability on die cost is discussed next to demonstrate the value in replacing RAM circuits with ROM circuits. In this analysis, 6-transistor SRAM memory is used to illustrate the salient features. The discussion is equally valid under any other volatile and non-volatile programmable elements such as DRAM, EPROM, and EEPROM among others. Four factors contribute to the cost of programmability: the area penalty for memory elements, the area penalty of providing multiple logic choices, the total available die in a wafer and the cost penalty for wasted die due to killer defects.

Figure 8A:
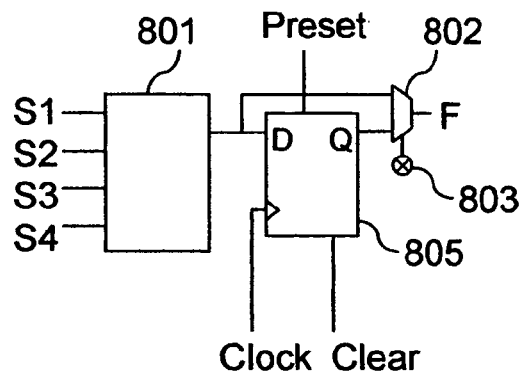
FIG. 8A shows a 4-input LUT based programmable logic element
Figure 8B:
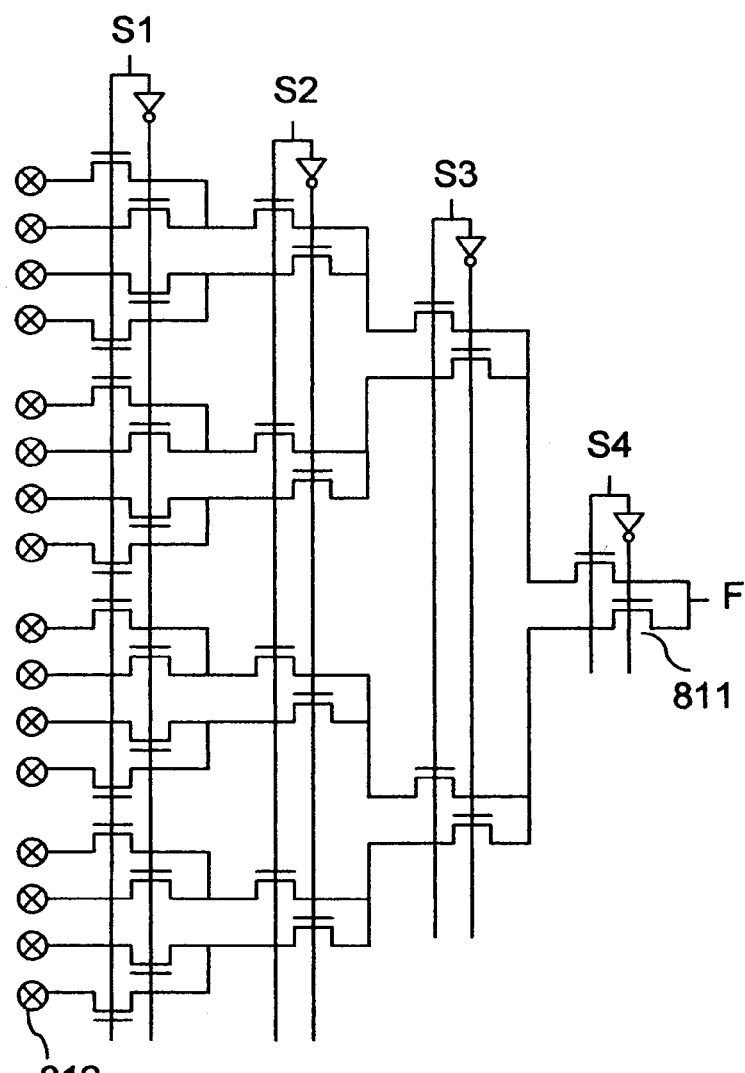
FIG. 8B shows a gate realization of a 4-input LUT.
Figure 9:
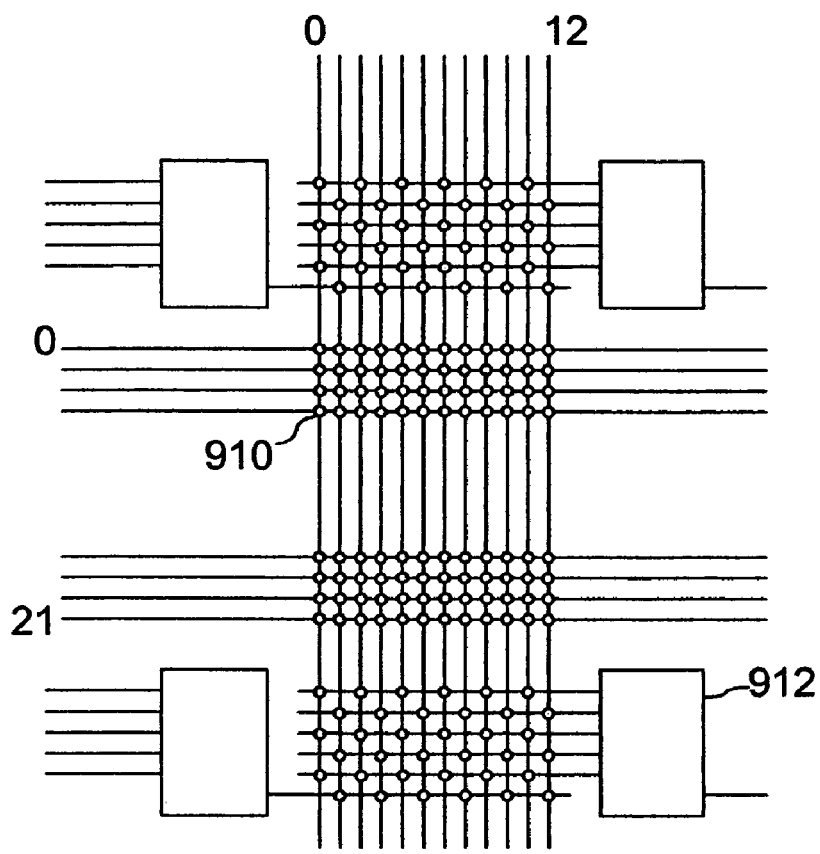
FIG. 9 shows a routing block with four programmable logic elements.

The memory required for programmable logic is illustrated in a 4-input look-up-table (LUT) based logic element (LE) shown in FIG. 8A. LUT 801 comprising 4-inputs S1, S2, S3 and S4 can implement any 4-input function. MUX 802 having a memory bit 803 shown in crossed-circle is used to implement sequential or combinational logic. D-flip-flop 805 is used for sequential logic, and bi-passed for combinational logic. The simple logic element, analogous to the MUX structure in FIG. 1A, has five inputs (including the clock signal) and one output. A detail gate-diagram of LUT 801 is shown in FIG. 8B. A 4-input LUT comprises 16 memory bits such as 812, and 30 pass-gates such as 811. Each memory bit such as 812 is programmed as needed by the LUT function to output a logic one or a logic zero. In FIG. 8, the memory element 812 is identical to the memory element 803 in FIG. 8A. Each logic element interacts with the routing block (RB) as shown in FIG. 9. Inputs and outputs are selected from a plurality of horizontal and vertical wires in the RB. Each access point 910 is a point to point connection, similar to FIG. 3, including a pass-gate and a memory element. These memory elements are embedded in the configuration circuits to allow the user access to change RAM data. In FIG. 9, the 5 inputs and 1 output (six I/O wires) to logic elements such as 912 are shown to have 50% connectivity to the 12 vertical wires. The 12 vertical wires have 100% connectivity to the 22 horizontal wires in the routing block (RB). This connectivity population can change with the FPGA architecture, with some commercially available products showing only 10% population in RB. The main reason for such low population is the lack of Silicon real estate available to provide more switches. Each connection point, such as element 910, comprises 6-transistors for the SRAM memory bit and 1 pass-gate. In FIG. 9, the six I/O wires to a logic element require 36 switches. The 12×22 routing block (RB) between horizontal and vertical wires contains 264 switches. Allocating a quarter of those switches for each of the four logic elements (LE) shown, there are 86 switches in RB for one LE. Combining memory bits and pass-gates from FIG. 8 and FIG. 9, it is seen that each simple programmable LE requires 139 (17 LE+36 I/O+86 RB) SRAM bits, 154 (32 LE+36 I/O+86 RB) pass-gates and one D-flip-flop. As each SRAM bit comprises 6 transistors, it is clear that a significant Silicon area is needed to construct configuration circuits in programmable logic devices. Commercially available FPGA devices show 30–50% of the Silicon foot-print taken up by the RAM elements. This calculation includes pad area and memory area that is typically present in most FPGA devices. A limiting step in programmable logic architecture is in the high Silicon foot-print for configuration memory.

Figure 10:
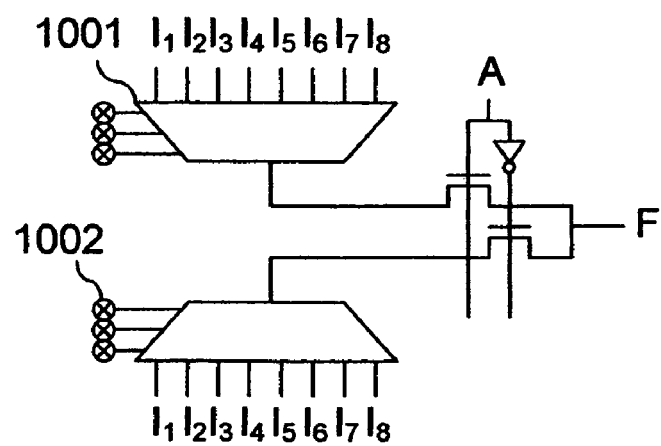
FIG. 10 shows a 2:1 MUX with programmable input selections.

A second limitation in programmable logic is in the expense of providing multiple logic choices. Multiple logic choices provided in a 2:1 MUX is illustrated in FIG. 10. The 2:1 MUX with control logic "A" and output "F" has MUX input values selected by two 8:1 MUXs. Each 8:1 MUX 1001 provides a programmable means for an input to be selected from 8 available input choices $I_1$–$I_8$ by the user. Three programmable memory bits such as 1002 are provided per 8:1 MUX for the user to select the desired input. As this is a programmable choice, all of the available 8 inputs must be able to connect in the MUX. A defect that affects any of these possible connections is a killer defect in the PLD, making the die non functional. During RAM FPGA testing, all the possible MUX connections are tested. If one connection is faulty, the die is rejected. In an ASIC, a simple hard-wire connection replaces the entire 8:1 MUX, saving considerable memory over-head and logic circuitry overhead. Seven of the eight provided logic choices in the MUX are eventually redundant. When one input is hard-wired by a ROM replacement of the three RAM bits, a defect in seven unused input choices pose no threat to the selected connection. There are some hard defects that may affect the yields, but a majority of defects such as two unused input wires shorted together, an unused input gate oxide is shorted to substrate, etc. do not affect the yield. This apparent defect density reduction results from the lower utilization of programmable circuits in the ROM option compared to the RAM option. A method to quantify this lower defect density can be achieved by realizing an effective Silicon area A' ($cm^2$) utilized in the ROM option, compared to the Silicon area A ($cm^2$) utilized in the RAM option. If the process has a typical defect density given by D ($def/cm^2$), the apparent defect density D' ($def/cm^2$) is given by:

$$D'=D*A'/A \qquad \text{EQ. 1}$$

When the ROM utilization area is very small compared to RAM area, the apparent defect density becomes very small. A true estimate of A versus A' is quite complicated to achieve. A simpler method is to take the FPGA die area A, and estimate an equivalent ASIC die area A' that can provide the same functionality as the FPGA. ROM version of the FPGA would hard-wire a similar die area A'. For a commercially available FPGA device on 0.15μ process technology, we have estimated the following:

$$A(FPGA)=300 \text{ mm}^2, A'(ASIC)=88 \text{ mm}^2$$

A typical FPGA core is estimated to be at least 10–20× larger in Silicon area compared to an ASIC. The commercial die example above includes memory, I/O pads, multipliers and other fixed area circuitry common to both FPGA and ASIC. Under such conditions, a process with D=0.5 def/cm2 reduces to D'=0.147 $def/cm^2$ from EQ-1 for the ROM option of the FPGA. As some defects in the extraneous circuitry such as Vcc shorts and Vss shorts can still lend to killer defects, not all of this lower apparent defect density is realized in a real situation. That can be easily incorporated into a higher defect density by setting D' higher than estimated by EQ-1 as follows:

$$D'=1.1*D*A'/A \qquad \text{EQ. 2}$$

In the example discussed, the 10% higher defect density yields D'=0.16 def/cm2 for the 88 $mm^2$ ROM version of a 300 $mm^2$ RAM based FPGA. The functional die yield Y (%) in a Semiconductors IC is modeled by the die area A ($cm^2$), defect density D ($def/cm^2$) and the probability of no defects in the Gamma Distribution function from Ref-3 (Sze) as:

$$Y=1/[1+S*A*D]^{(1/S)} \qquad \text{EQ. 3}$$

$$N=0.90*\pi*(20/2)^2/A \qquad \text{EQ. 4}$$

$$n=Y*N \qquad \text{EQ. 5}$$

where, S is the square of the coefficient of variance, taken as 1/12 in this discussion. N is the total available die in a 200 mm diameter Silicon wafer assuming 90% of the wafer can be efficiently used to print full die. The parameter π, which is ~3.14, is the ratio of circumference to diameter of a circle. The cost of a good die decreases as the number of good die per wafer (DPW) n in the wafer increase.

For the FPGA with RAM option, where A=300 $mm^2$, using D=0.5 $def/cm^2$ and S=1/12 in EQ-3, EQ-4 and EQ-5:

Y=24.3%, N=94 DPW, n=22 DPW

The same FPGA converted to a ROM option, where A'=88 $mm^2$, but A=300 $mm^2$ is unchanged, using D'=0.16 and S=112 in EQ-3, EQ-4 and EQ-5:

Y=62.5%, N=94 DPW, n=58 DPW

As the process and wafer cost remain identical between the two options, the latter ROM die cost is seen to be 2.6×cheaper than the identical RAM option. One can easily compare this to the ideal ASIC die cost by using A=88 $mm^2$, using D=0.5 $def/cm^2$ and S=1/12 in EQ-3, EQ-4 and EQ-5:

Y=64.9%, N=321 DPW, n=208 DPW

In this example, the ASIC die is 9.5×cheaper than the RAM option of the FPGA, and 3.6×cheaper than the ROM option of the FPGA. However, to obtain an ASIC die the user has to incur 0.5–1.0 year Silicon fabrication, debug and qualification time and spend over 2M$ in NRE costs just for chip layout, masks and fabrication. At $2400 wafer prices, the RAM FPGA is economical for life time volumes less than 20,500 while the ROM FPGA is economical for life time volumes under 67,000 units. The cost associated with saving 8 months in shipping a product for an organization having a burn rate of 250 K$/month (20 person engineering team in the US) is another 2M$. A more meaningful economical balance is for an ASIC design option to save over 4M$ during life time shipments compared to an FPGA solution. For a 4M$ overall ASIC NRE cost, the RAM based FPGA is more economical when life time volume is under 41,000 units, while the ROM based FPGA is more economical when life time volume is under 134,000 units. Over 50% of designs ship under 100,000 units over a life time. The ROM based FPGA provides a significant cost advantage compared to the RAM based FPGA, and is more economical than an ASIC design for a majority of design opportunities. In this disclosed product duality, the system designer uses the RAM FPGA to debug, tweak and proto-type the initial system solution, then moves to cheaper ROM version for mass production. There is no engineering involved with the change, there is a single custom mask cost to the user. In a first embodiment the fabrication process steps do not change as RAM and ROM constructions use identical steps. In a second embodiment the fabrication process is made simpler by removing the custom processing steps needed only for RAM construction.

The disclosure describes a programmable logic device and an application specific device fabrication from the same base Silicon die. The PLD is fabricated with a programmable RAM module, while a cheaper option is fabricated with a conductive ROM pattern in lieu of the RAM. Both RAM module and ROM module provide identical control of logic circuits. For each set of RAM bit patterns, there is a unique ROM pattern to achieve the same logic functionality. The apparent defect density reduction in the hard-wire circuits leads to a significant cost reduction for the ROM version. Such conversions allow the user a lower cost and more reliable end product. These products offer an enormous advantage in lowering NRE costs and improving TTS in the ASIC design methodology in the industry.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. An integrated circuit (IC) comprising:
   a first selectable fabrication option comprised of a user configurable memory circuit; and
   a second selectable fabrication option comprised of a hard-wired circuit in lieu of said user configurable memory circuit;

wherein, the IC functionality and performance is substantially identical for a given configuration utilizing the first or second fabrication options.

2. The IC of claim 1, wherein said first selectable option comprises a configurable Random Access Memory (RAM) module.

3. The IC of claim 1, wherein said second selectable option comprises a Read Only Memory (ROM) module.

4. The IC of claim 1, further comprising:
an input said input received at an input-pad; and
an output, said output generated at an output-pad; and
an input to output signal propagation delay, said delay substantially identical between said first and said second selectable fabrication options.

5. The IC of claim 1, wherein said hard-wire circuit comprises at least one custom mask, said at least one mask facilitating:
a power-bus connection to replace a logic one in said configurable memory circuit; and
a ground-bus connection to replace a logic zero in said configurable memory circuit.

6. The IC of claim 2, wherein said RAM element is selected from one of volatile and non-volatile memory elements.

7. The IC of claim 2, wherein said RAM element is selected from one of fuse links, anti-fuse capacitors, SRAM cells, DRAM cells, metal optional links, EPROM cells, EEPROM cells, flash cells, ferro-electric elements, optical elements, electro-chemical elements and magnetic elements.

8. A programmable logic device (PLD) comprising:
two selectable memory construction options to control logic circuits, wherein:
a first selectable option comprises a random access memory (RAM) construction; and
a second selectable option comprises a hard-wire read only memory (ROM) construction;
wherein, the logic circuits construction comprises one or more masking patterns that are invariant to the memory construction options.

9. The device of claim 8, wherein said first selectable option comprises a configuration circuit to configure said RAM.

10. The device of claim 8, wherein said second selectable option comprises mapping one of said first selectable option RAM bit patterns to a hard-wire ROM pattern.

11. The device of claim 8, further comprising:
an input, said input received at an input-pad; and
an output, said output generated at an output-pad; and
an input to output signal propagation delay, said delay substantially identical between said RAM and said ROM logic control options.

12. The device of claim 8, wherein said RAM element is selected from one of volatile and non-volatile memory elements.

13. The device of claim 8, wherein said RAM element is selected from one of fuse links, anti-fuse capacitors SRAM cells, DRAM cells, metal optional links, EPROM cells, EEPROM cells, flash cells, ferro-electric elements, optical elements, electro-chemical elements and magnetic elements.

14. The device of claim 8, further comprising a pass-gate logic element, said logic element providing a programmable means for electrically connecting or disconnecting two nodes.

15. The device of claim 14, wherein said programmable means in said first selectable option comprises configuring a RAM bit, said RAM bit generating:
a logic one output to connect said two nodes; and
a logic zero output to disconnect said two nodes.

16. The device of claim 14, wherein said programmable means in said second selectable option comprises hard-wiring a ROM bit said ROM bit providing:
a hard-wire to power-bus to connect said two nodes; and
a hard-wire to ground-bus to disconnect said two nodes.

17. A configurable pass-gate logic element, to electrically couple two nodes in a programmable logic device (PLD), comprising:
a configuration circuit to configure the pass-gate logic element, said configuration achieved by a memory element in the configuration circuit, wherein the memory element construction comprises:
a first selectable option comprising a random access memory (RAM) construction; and
a second selectable option comprising a hard-wire read only memory (ROM) construction;
wherein, the pass-gate logic element construction comprises one or more masking patterns that are invariant to the memory construction options.

18. The element of claim 17, further comprised of a first node to a second node signal propagation delay, said delay substantially identical between said first and said second selectable memory construction options.

19. The element of claim 17, wherein constructing said second selectable hard-wire ROM comprises at least one custom mask, said at least one mask facilitating;
a power-bus ROM connection to replace a logic one in said RAM element; and
a ground-bus ROM connection to replace a logic zero in said RAM element.

20. The element of claim 17, wherein said RAM element is selected from one of fuse links, anti-fuse capacitors, SRAM cells, DRAM cells, metal optional links, EPROM cells, EEPROM cell, flash cell, ferro-electric elements, optical elements, electro-chemical elements and magnetic elements.

* * * * *